United States Patent [19]

Meliconi

[11] Patent Number: 4,836,256
[45] Date of Patent: Jun. 6, 1989

[54] SHOCKPROOF PROTECTIVE SHEATH FOR REMOTE CONTROLS, IN PARTICULAR THOSE OF TELEVISION RECEIVERS

[75] Inventor: Loris Meliconi, Granarolo Emilia, Italy

[73] Assignee: Meliconi s.r.l., Bologna, Italy

[21] Appl. No.: 147,818

[22] Filed: Jan. 25, 1988

[30] Foreign Application Priority Data

Jan. 30, 1987 [IT] Italy .................................. 3332 A/87

[51] Int. Cl.$^4$ ........................ B65D 85/38; G06C 5/00
[52] U.S. Cl. .................................. 206/523; 206/523;
206/305; 235/1 D; 358/305
[58] Field of Search ............. 206/305, 523; 150/52 R, 150/52 J, 52 B; 235/1 D

[56] References Cited

U.S. PATENT DOCUMENTS

| 4,165,554 | 8/1979 | Faget | 206/305 X |
| 4,420,078 | 12/1983 | Belt et al. | 206/305 |
| 4,458,813 | 7/1984 | Tushinsky et al. | 206/305 X |
| 4,703,160 | 10/1987 | Narishima et al. | 206/305 |
| 4,733,776 | 3/1988 | Ward | 206/305 |
| 4,762,227 | 8/1988 | Patterson | 206/305 X |

Primary Examiner—William Price
Attorney, Agent, or Firm—Fay, Sharpe, Beall, Fagan, Minnich & McKee

[57] ABSTRACT

A shockproof protective sheath for television remote controls, which comprises a hollow container and holder element, embodied in shockproof material, that substantially matches and hugs the external profile of the appliance it encompasses and is provided with at least two openings, one of which affording access to the push buttons, the other allowing passage of the control pulses.

13 Claims, 1 Drawing Sheet

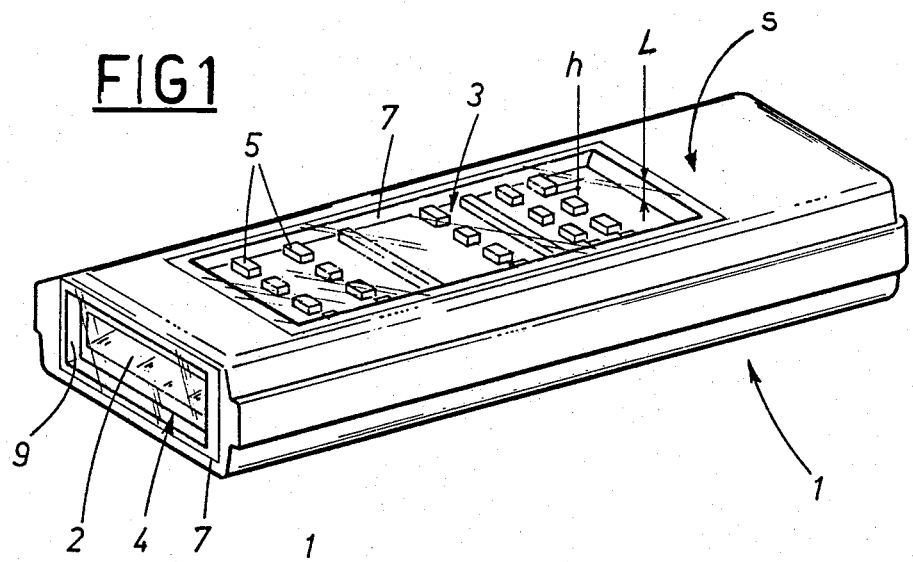
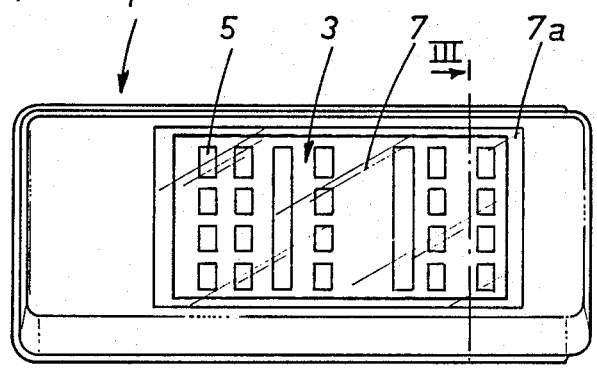
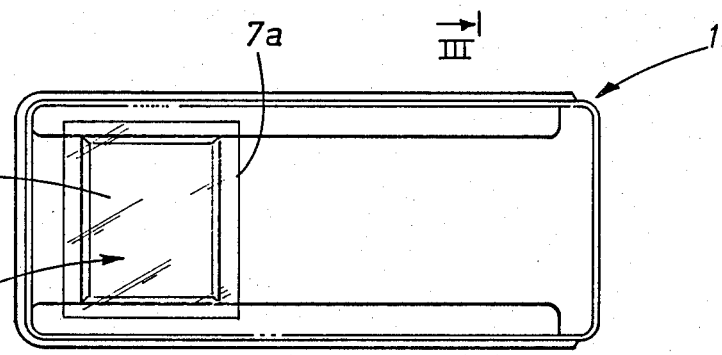
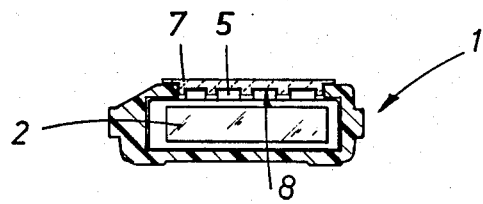

SHOCKPROOF PROTECTIVE SHEATH FOR REMOTE CONTROLS, IN PARTICULAR THOSE OF TELEVISION RECEIVERS

BACKGROUND OF THE INVENTION

The invention relates to a shockproof protective sheath for remote controls, and in particular, those of television receivers.

Currently, the boxes or cases supplied with remote control appliances are either punched from cardboard or molded in polystyrene, and designed simply to protect the appliance from knocks and scrapes when packaged for transit. In effect, once opened to permit removal of the remote control, such boxes are of no further use, as there is no system incorporated in manufacture whereby they can be re-fastened; a box of this conventional type is therefore awkward, and to replace the remote control in such a container every time it is used is totally impractical.

Thus, when in general use, the remote control must remain without a protective casing that will shield it from accidental shocks, when dropped or knocked against other objects, or from external agents such as dust, damp or other contaminants that precipitate onto it and foul the electrical contacts, so that smooth operation is jeopardized.

Tentative attempts have been made to protect remote control appliances from the hazards mentioned above, for example by enveloping them in sheets of wrapping material or inserting them in foam rubber covers; expedients such as these are inconvenient and impractical however, and fail to afford complete protection.

Accordingly, the object of the present invention is to overcome such drawbacks.

SUMMARY OF THE INVENTION

The stated object is achieved with a protective sheath as disclosed and claimed herein.

Such a sheath consists essentially in a hollow element that is fashioned from lightweight, low density, shockproof material, substantially to match the external shape of the remote control it encases, and is able to ensure efficient protection against shocks and contaminants while enabling unimpeded use of the control buttons.

One of the advantages of the sheath according to the invention is that it is highly practical in use, both as a wrapping pure and simple, during transit, and as a protective casing during general service.

A further advantage of the invention is that of its pleasing appearance; the sheath can be embodied in a variety of colors, and thus blended in with those of the surrounding interior.

BRIEF DESCRIPTION OF THE DRAWINGS

The invention will now be described in detail, by way of example, with the aid of the accompanying drawings, in which: FIG. 1 is a perspective illustrating the protective sheath according to the invention, fitted over a remote control appliance; FIGS. 2a and 2b are full frontal views of the top and the bottom of the sheath illustrated in FIG. 1; FIG. 3 is the section through III—III in FIG. 2a.

DESCRIPTION OF THE PREFERRED EMBODIMENTS

With reference to FIG. 1, the sheath according to the invention consists in an element 1, fashioned from low density, lightweight, shockproof material, that contains and holds a remote control appliance, denoted 2.

The container and holder element 1 is hollow, with an internal shape that substantially matches and hugs the external profile of the remote control appliance it is designed to accommodate.

The element 1 exhibits at least two openings denoted 3 and 4 (FIGS. 1 and 2a), which afford access to the remote control buttons 5, and allow passage of the control pulses, respectively. The embodiment shown in the drawings has an additional opening 6 affording access to the compartment that houses the batteries supplying power to the appliance (FIG. 2b).

All of the openings mentioned are covered over by a window 7 of thin transparent film, by which a total protection is afforded to the appliance 2, even from external agents such as dust, moisture, and other contaminants. The film window 7 can be simply welded the edges of each opening 3, 4 and 6, and might be floppy or semi-rigid in consistency.

Again, the film window 7 might be provided along its outermost edge 7a with an adhesive strip so to permit of easy attachment and removal; thus, in the particular instance of the transparent window which covers the opening denoted 6, access to the battery compartment is gained without the need to remove the appliance 2 from the container and holder element 1.

FIG. 3 illustrates an alternative embodiment of the transparent film, in which the window 7 will be seen to be molded with sockets 8 for accommodation of the corresponding remote control buttons 5; given that the buttons 5 of TV remote control appliances are grouped close together, the sockets 8 will be embodied such, that when pressure is exerted on the window in depressing a given button 5, the adjacent buttons will remain unaffected.

The walls of the container and holder element 1 must be thick enough to absorb the effects of any shock occasioned when the remote control appliance 2 is dropped, or knocked accidentally against some other object; FIG. 1, in particular, illustrates how the depth L of the top S of the element 1, which incorporates the opening 3 affording access to the buttons 5, will be greater than the height h of the buttons 5, or at very least, equal thereto.

The opening 4 through which the remote control pulses are emitted will be of dimensions such as to permit insertion of the appliance 2 into the sheath; in the embodiment illustrated, this particular opening 4 is provided with an inwardly projecting raised bead 9 which extends in unbroken fashion around its entire periphery and serves to retain the appliance 2 in position once inserted into the element 1.

What is claimed

1. A shockproof protective sheath for a remote control unit having control buttons, comprising: a container and holder element, fashioned hollow from a shockproof, low density material in a shape substantially matching and hugging that of the remote control unit it ensheathes, provided with at least two openings affording access to the control buttons of the unit and allowing passage of the control pulses emitted, respectively, wherein the control button opening is covered by a window fashioned from a transparent film material, the window of film material being molded with a plurality of sockets, each one of which is designed to accommodate a respective control button, and wherein the holder element is provided with walls of a thickness sufficient to absorb the shock occasioned when the appliance is dropped or knocked accidentally against other objects.

2. The sheath as in claim 1, wherein the window comprises a floppy film material, and is attached by a weld joint effected along the edges of the opening in said container and holder element.

3. The sheath as in claim 1, wherein the window of film material is provided with an adhesive strip running around its periphery.

4. The sheath as in claim 1, wherein the window comprises a semirigid film material.

5. The sheath as in claim 1, wherein the container and holder element is provided with a further opening that affords access to the compartment housing the batteries by which the remotee control appliance is powered.

6. The sheath as in claim 1, wherein the opening allowing passage of the control pulses is of dimensions such as enable insertion of the remote control appliance into the container and holder element.

7. A shockproof protective sheath for a remote control unit having control buttons, comprising:
a container and holder element, fashioned hollow from a shockproof, low density material in a shape substantially matching and hugging that of the remote control unit it ensheathes, provided with at least two openings affording access to the control buttons of the unit and allowing passage of the control pulses emitted, respectively, and embodied with walls of thickness sufficient to absorb the shock occasioned when the appliance is dropped or knocked accidentally against other objects, wherein the opening allowing passage of the control pulses is provided with an inwardly projecting rib that serves to retain the remote control unit once inserted into the container and holder element.

8. The sheath as in claim 1, wherein a thickness of a top face of the container and holder element, which face exhibits the opening affording access to the control buttons, is at least as large as the height of the buttons.

9. The sheath as in claim 7, wherein the inwardly projecting rib extends unbroken around the periphery of the opening allowing passage of the control pulses.

10. The sheath as in claim 3 wherein the window of film material is provided with an adhesive strip running around its periphery.

11. The sheath as in claim 1 further comprising a window fashioned from a transparent film material covering the opening allowing passage of the control pulses emitted.

12. The sheath as in claim 7 further comprising a window fashioned from a transparent film material for covering the opening affording access to the control buttons.

13. The sheath as in claim 12 wherein said window is provided with a plurality of sockets, each one of which is designed to accommodate a respective control button.

* * * * *